United States Patent
Choi et al.

(10) Patent No.: US 9,253,413 B2
(45) Date of Patent: Feb. 2, 2016

(54) WDR PIXEL ARRAY, WDR IMAGING APPARATUS INCLUDING THE SAME AND METHOD FOR OPERATING THE SAME

(75) Inventors: Woon Il Choi, Seoul (KR); Masashi Hashimoto, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 154 days.

(21) Appl. No.: 14/111,619

(22) PCT Filed: Apr. 29, 2011

(86) PCT No.: PCT/KR2011/003237
§ 371 (c)(1),
(2), (4) Date: Feb. 24, 2014

(87) PCT Pub. No.: WO2012/141370
PCT Pub. Date: Oct. 18, 2012

(65) Prior Publication Data
US 2014/0152884 A1    Jun. 5, 2014

(30) Foreign Application Priority Data

Apr. 13, 2011    (KR) .................. 10-2011-0034459

(51) Int. Cl.
*H04N 5/235*  (2006.01)
*H01L 27/146* (2006.01)
*H04N 5/355* (2011.01)

(52) U.S. Cl.
CPC ........ *H04N 5/2354* (2013.01); *H01L 27/14609* (2013.01); *H04N 5/35572* (2013.01)

(58) Field of Classification Search
CPC . H04N 5/374; H04N 5/2354; H04N 5/35572; H04N 5/335; H04N 5/2355; H04N 5/2356; H04N 5/355; H04N 5/35581; H04N 3/1556; H04N 5/343; H04N 5/3765; H01L 27/14609
See application file for complete search history.

(56) References Cited

U.S. PATENT DOCUMENTS

| | | | | |
|---|---|---|---|---|
| 6,002,123 A | * | 12/1999 | Suzuki | 250/208.1 |
| 8,179,459 B2 | * | 5/2012 | Koizumi | 348/294 |
| 8,324,550 B2 | * | 12/2012 | Lyu | 250/208.1 |
| 2004/0096124 A1 | * | 5/2004 | Nakamura | 382/308 |

(Continued)

FOREIGN PATENT DOCUMENTS

| | | |
|---|---|---|
| JP | 2006-197382 A | 7/2006 |
| JP | 2007-300410 A | 11/2007 |

(Continued)

OTHER PUBLICATIONS

International Search Report in International Application No. PCT/KR2011/003237, filed Apr. 29, 2011.

*Primary Examiner* — Aung S Moe
(74) *Attorney, Agent, or Firm* — Saliwanchik, Lloyd & Eisenschenk

(57) ABSTRACT

Disclosed is a WDR pixel array having high sensitivity under the middle intensity of illumination and high intensity of illumination by using the 4T pixel structure representing high sensitivity under the low intensity of illumination. According to the embodiment, the overflow charges generated under the very high intensity of illumination are not discarded or partially stored, but read through the 3T pixel operation, so that the WDR pixel array having high sensitivity under the middle intensity of illumination and high intensity of illumination can be obtained based on the 4T pixel structure without additionally providing a transistor or a photodiode for the high intensity of illumination in the WDR pixel array.

12 Claims, 7 Drawing Sheets

(56) References Cited

U.S. PATENT DOCUMENTS

| | | |
|---|---|---|
| 2006/0102827 A1* | 5/2006 | Kasuga et al. ............. 250/208.1 |
| 2006/0157759 A1 | 7/2006 | Okita et al. |
| 2007/0263106 A1 | 11/2007 | Tanaka et al. |
| 2008/0239126 A1* | 10/2008 | Wakamori .................... 348/308 |
| 2009/0002528 A1* | 1/2009 | Manabe et al. ............... 348/248 |
| 2009/0101796 A1* | 4/2009 | Ladd et al. ................... 250/206 |
| 2010/0097508 A1* | 4/2010 | Yanagita et al. ............. 348/301 |
| 2010/0188541 A1* | 7/2010 | Mabuchi et al. ............. 348/302 |
| 2012/0001082 A1* | 1/2012 | Shoho et al. ................. 250/369 |
| 2012/0002089 A1* | 1/2012 | Wang et al. .................. 348/297 |
| 2012/0068051 A1* | 3/2012 | Ahn et al. ................. 250/208.1 |

FOREIGN PATENT DOCUMENTS

| | | |
|---|---|---|
| JP | 2010-206719 A | 9/2010 |
| KR | 10-2009-0073562 A | 7/2009 |

* cited by examiner (a) Low intensity of illumination (b) Middle intensity of illumination (c) High intensity of illumination (d) Very high intensity of illumination

WDR PIXEL ARRAY, WDR IMAGING APPARATUS INCLUDING THE SAME AND METHOD FOR OPERATING THE SAME

CROSS-REFERENCE TO RELATED APPLICATIONS

This application is the U.S. national stage application of International Patent Application No. PCT/KR2011/003237, filed Apr. 29, 2011, which claims priority to Korean Application No. 10-2011-0034459, filed Apr. 13, 2011, the disclosures of each of which are incorporated herein by reference in their entirety.

TECHNICAL FIELD

The embodiment relates to a WDR (wide dynamic range) pixel array, an imaging apparatus including the same and a method for operating the same. More particularly, the embodiment provides a WDR pixel array having high sensitivity under the middle intensity of illumination and high intensity of illumination by using the 4T pixel structure representing high sensitivity under the low intensity of illumination. According to the embodiment, the overflow charges generated under the very high intensity of illumination are not discarded or partially stored, but read through the 3T pixel operation, so that the WDR pixel array having high sensitivity under the middle intensity of illumination and high intensity of illumination can be obtained based on the 4T pixel structure without additionally providing a transistor or a photodiode for the high intensity of illumination in the WDR pixel array.

BACKGROUND ART

A dynamic range is one of important factors to determine the quality of an image sensor. In general, the dynamic range refers to the maximum range for processing signals without distorting input signals. In the case of the image sensor, images having the superior quality can be obtained as the dynamic range becomes widened regardless of the brightness variation.

However, according to the color image sensor of the related art, the dynamic range is so narrow that the original color of the image may not be expressed well when one of red, green and blue colors is saturated. In order to solve the problem caused by the narrow dynamic range, a WDR (wide dynamic range) pixel has been suggested.

First, there has been suggested a method of realizing the WDR operation by adjusting irradiation time of the light in the image sensor of the related art.

Second, there has been suggested a method of providing an additional capacitor to change FD (floating diffusion) capacity, in which a pixel structure includes a transistor to adjust the additional capacitor so that overflow charges, which are generated from a PD (photodiode) under the high intensity of illumination as light intensity is increased, can be stored in the additional capacitor.

Third, there has been suggested a method of providing a WDR pixel, in which two PDs are installed in one pixel such that charges generated from the two PDs are combined with each other.

However, according to the first method, the sensitivity is constant regardless of the variation of light intensity (that is, high intensity of illumination and low intensity of illumination), so that the image may be darkened under the low intensity of illumination. In addition, while the pixel is being operated, the timing adjustment for the pixel operation under the high intensity of illumination may be limited.

DISCLOSURE OF INVENTION

Technical Problem

The embodiment provides a WDR pixel array having high sensitivity under the middle intensity of illumination and high intensity of illumination by using the 4T pixel structure representing high sensitivity under the low intensity of illumination, and a method for operating the WDR pixel array.

Solution to Problem

A method for operating a pixel according to the embodiment includes the steps of flushing a photo-electro conversion unit and a storage region by applying a reset signal to a reset switching unit; reducing an integration time required for accumulating overflow charges generated from the photo-electro conversion unit in the storage region; reading an overflow signal level of the storage region; draining optical charges stored in the storage region by applying the reset signal to the reset switching unit; reading a reset signal level; transferring the stored optical charges from the photo-electro conversion unit to the storage region by turning on a transfer switching unit; and reading a signal level of the optical charges transferred to the storage region.

An imaging apparatus according to the embodiment includes a photo-electro conversion unit on a substrate; a transfer switching unit on the substrate at one side of the photo-electro conversion unit; a storage region on the substrate at one side of the transfer switching unit; a plurality of pixels including a reset switching unit on the substrate at one side of the storage region; and a control circuit reading a signal level and a reset signal level and applying a signal to the transfer switching unit and the reset switching unit. The control circuit reduces an integration time required for accumulating overflow charges generated from the photo-electro conversion unit in the storage region, reads an overflow level of the photo-electro conversion unit, applies a reset signal to the reset switching unit to drain optical charges stored in the storage region, reads the reset signal level, turns on the transfer switching unit to transfer the stored optical charges from the photo-electro conversion unit to the storage region, and reads a signal level of the optical charges transferred to the storage region.

Advantageous Effects of Invention

According to the embodiment, the overflow charges generated under the very high intensity of illumination are not discarded or partially stored, but read through the 3T pixel operation, so that the WDR pixel array having high sensitivity under the middle intensity of illumination and high intensity of illumination can be obtained based on the 4T pixel structure without additionally providing a transistor or a photodiode for the high intensity of illumination in the WDR pixel array.

MODE FOR THE INVENTION

Hereinafter, the embodiments will be described in detail with reference to the accompanying drawings.

Figure 1:
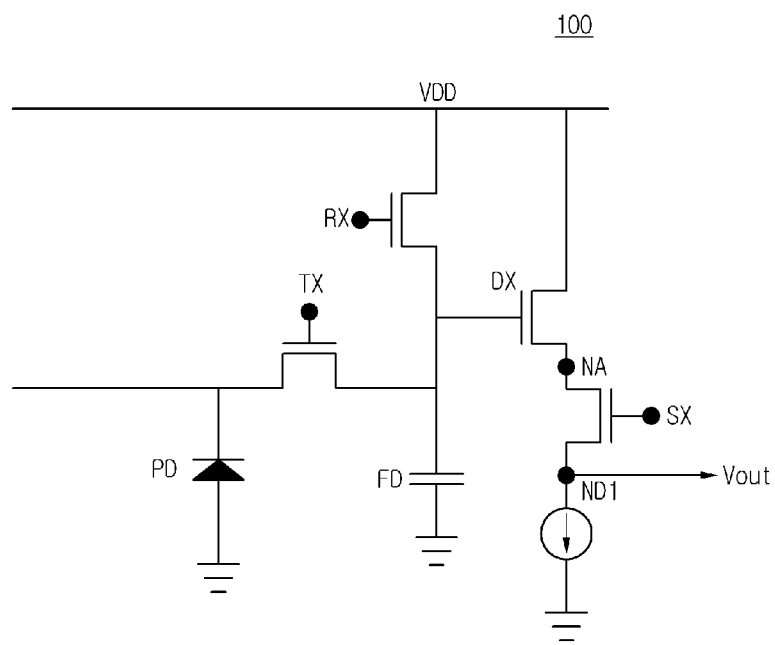
FIG. 1 is a circuit view of a WDR pixel according to one embodiment.

FIG. 1 is a circuit view of a WDR pixel 100 according to one embodiment.

As shown in FIG. 1, the WDR pixel 100 of the embodiment includes a photodiode PD, a transfer transistor TX, a floating diffusion node FD, a reset transistor RX provided at one side of the transfer transistor TX, a drive transistor DX and a select transistor SX.

The photodiode PD is an example of a photo-electro conversion unit according to the embodiment and receives photo energy to generate and store photo charges.

The transfer transistor TX an example of a transfer switching unit according to the embodiment and transfers the charges (or optical current) stored in the photodiode PD to the floating diffusion node FD in response to a control signal input into a gate.

The floating diffusion node FD is an example of a storage region according to the embodiment and receives the charges generated from the photodiode PD through the transfer transistor TX to store the charges therein.

The reset transistor RX is an example of a reset switching unit according to the embodiment and is connected between a power supply VDD and the floating diffusion node FD to drain the charges stored in the floating diffusion node FD to the power supply VDD in response to a rest signal RST.

The drive transistor DX (or source follower transistor) is an example of a drive switching unit according to the embodiment and is connected between the power supply VDD and a first node NA to source-follow the first node NA to the power supply VDD based on the charges stored in the floating diffusion node FD.

The select transistor SX is an example of a select switching unit according to the embodiment and is connected to the first node NA and an output node ND1 to form an electric route for the first node NA and the output node ND1 in response to a select signal SEL.

Figure 2:
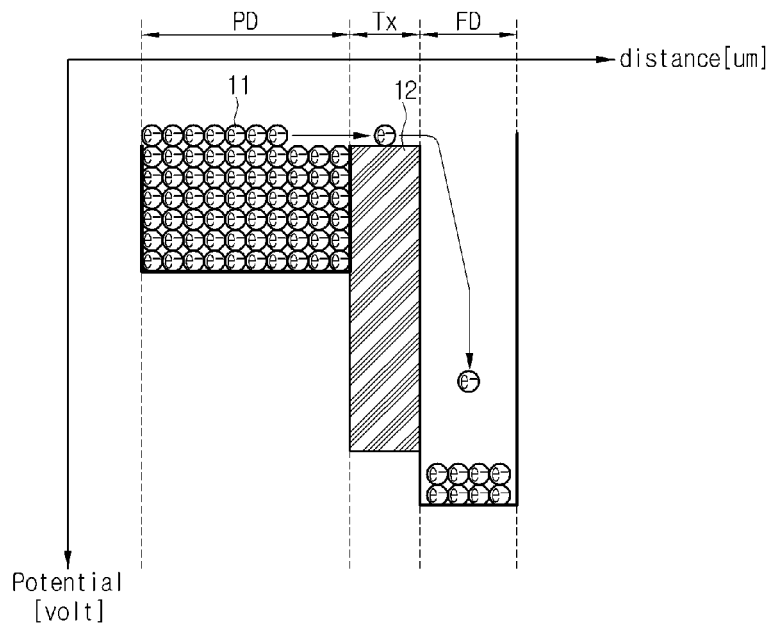
FIG. 2 is a schematic view for explaining the operation of a photodiode PD, a transfer transistor TX and a floating diffusion node FD.

FIG. 2 is a schematic view for explaining the operation of the photodiode PD, the transfer transistor TX and the floating diffusion node FD.

The photodiode PD receives the light to store charges 11 (electrons or holes) therein. The photodiode PD accumulates the charges 11 until the transfer transistor TX is turned on. However, as shown in FIG. 2, if the light exceeding the maximum capacity of the photodiode PD is received in the photodiode PD, the charges may overflow a channel potential barrier 12 of the transfer transistor TX kept in the turn-off state. This phenomenon is called "blooming". One of important functions of the transfer transistor TX is an anti-blooming function for preventing the charges from spreading to photodiodes of other pixels by overflowing the channel potential barrier 12 of the transfer transistor TX kept in the turn-off state. The intensity of overflow charges may not be read, and this limits the dynamic range under the high intensity of illumination in the related art.

However, according to the embodiment, the dynamic range can be expanded by reading the overflow charges. Different from the related art, the overflow charges are not drained, but collected to read the signal level of the overflow charges, so that the light having the high intensity of illumination can be read. Thus, according to the embodiment, the wide dynamic range can be realized by reading the overflow charges.

Figure 3:
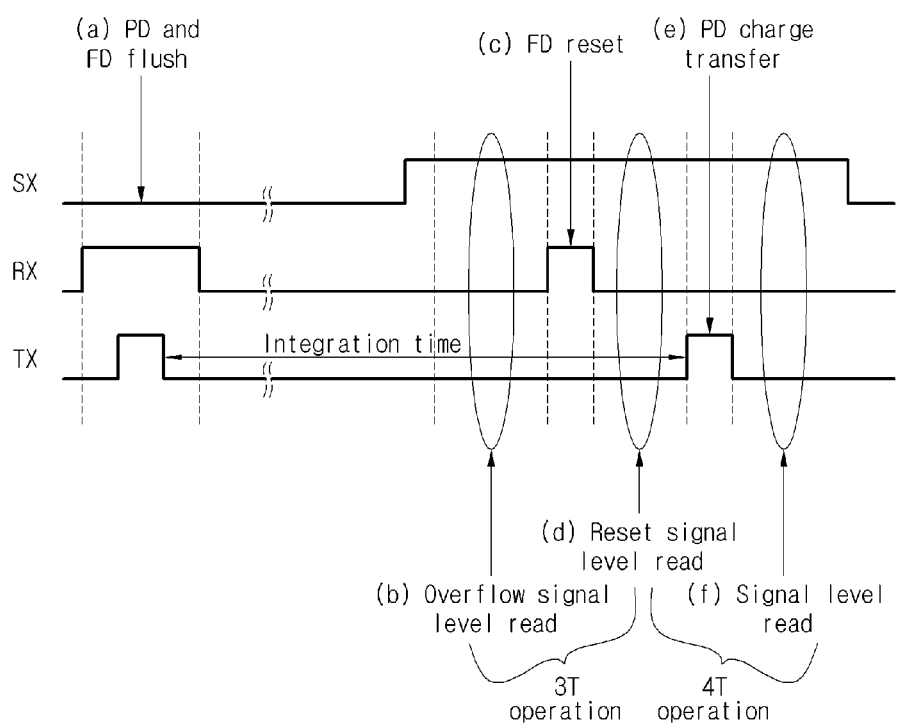
FIG. 3 is a timing diagram showing the switching operation of switching devices of a pixel according to the embodiment.
Figure 4:
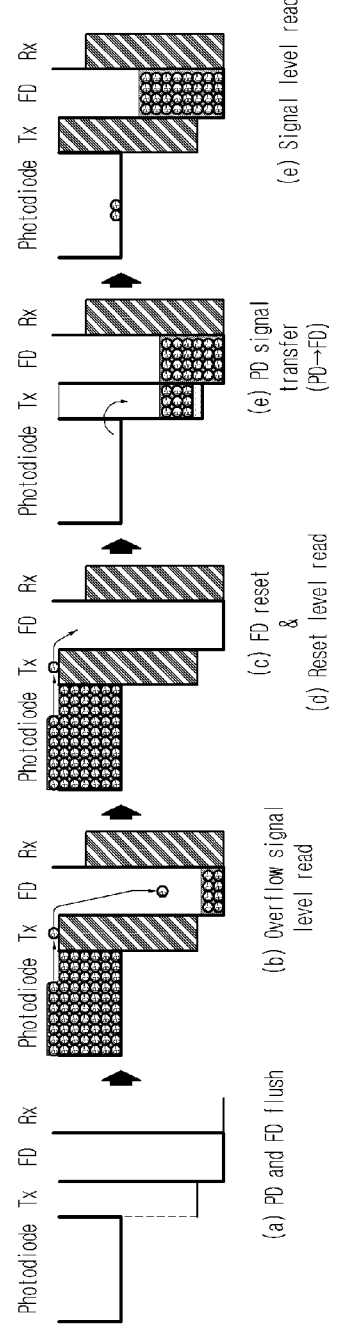
FIG. 4 is a schematic view showing the potential profile of PD, TX, FD and RX corresponding to the switching operation shown in FIG. 3.

FIG. 3 is a timing diagram showing the switching operation of the transfer transistor, the reset transistor RX, and the select transistor SX according to the embodiment, and FIG. 4 is a schematic view showing the potential profile of the photodiode PD, the transfer transistor TX, the floating diffusion node FD and the reset transistor RX corresponding to the switching operation shown in FIG. 3.

Figure 5:
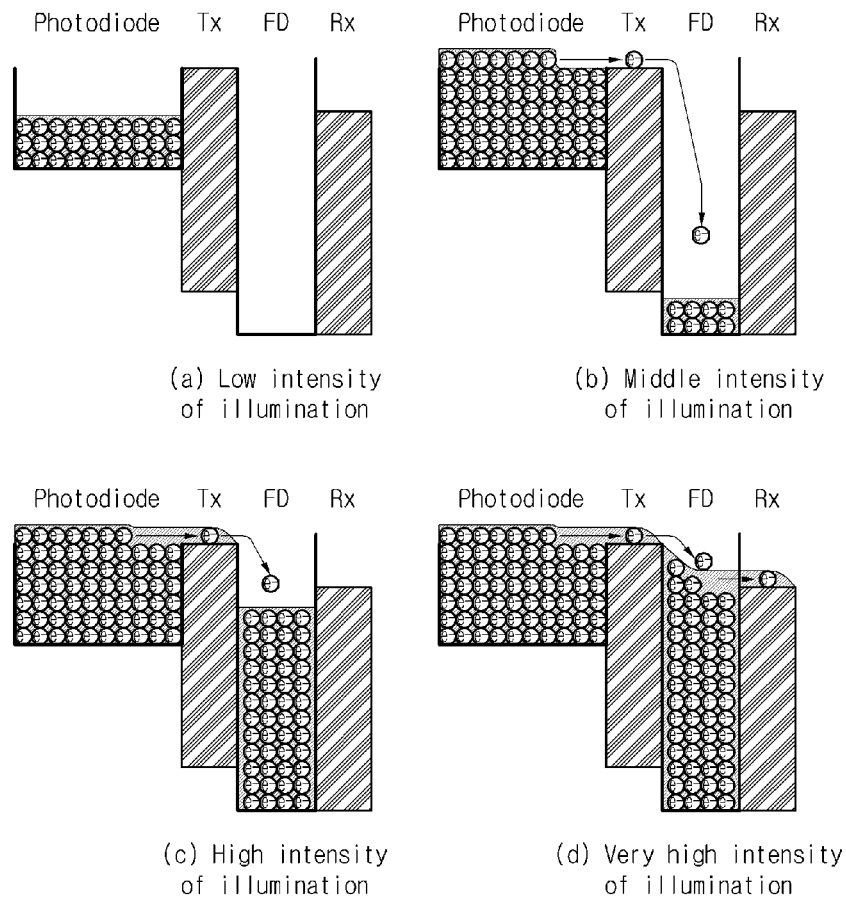
FIG. 5 is a schematic view showing quantity of charges generated under the low intensity, middle intensity, high intensity and very high intensity of illumination.

Referring to FIGS. 3 and 4, in the PD flush step (a), the transfer transistor TX and the reset transistor RX are turned on so that all charges remaining in the photodiode PD and the floating diffusion node FD are drained. Then, the transfer transistor TX and the reset transistor RX are turned off to perform the charge integration process. During the charge integration process, the overflow charges may be generated and there is variation in the quantity of the overflow charges depending on the light intensity, such as the low intensity, middle intensity, high intensity and very high intensity of illumination. FIG. 4(b) represents the middle intensity of illumination and FIG. 5 represents the low intensity, middle intensity, high intensity and very high intensity of illumination.

In the overflow signal level reading step (b), the level of the overflow signal transferred from the photodiode PD to the floating diffusion node FD is read. In the typical 4T pixel operation, that is, when four transistors TX, RX, SX and DX are used, the charges accumulated in the floating diffusion node FD is drained to the power supply VDD before the reset signal level of the floating diffusion node FD is read. However, according to the embodiment, the overflow charges transferred from the photodiode PD to the floating diffusion node FD are not drained, but read through the typical 3T pixel operation, in which the transfer transistor TX is not used. Different from the 3T pixel operation of the related art, according to the embodiment, the signal level of the overflow charges transferred to the floating diffusion node FD from the photodiode PD is read without reading the signal level of the charges accumulated in the photodiode PD.

Meanwhile, in order to read the signal level of the overflow charges, the select switching unit SX is turned on earlier than the related art. In detail, the select switching unit SX is turned on before the reset transistor RX is turned on to read the FD reset signal level.

In the FD reset step (c), the reset transistor RX is turned on to drain all charges of the floating diffusion node FD. In the reset signal level reading step (d), the FD reset signal level is read.

In the PD signal transfer step (e), the transfer transistor TX is turned on to transfer the charges accumulated in the photodiode PD to the floating diffusion node FD and then the transfer transistor TX is turned off. In the signal level reading step (f), the FD signal level is read.

Steps (b), (c) and (d) correspond to the 3T pixel operation, and steps (d), (e) and (f) correspond to the 4T pixel operation. Since the 3T pixel operation and the 4T pixel operation are performed in one pixel, the above operation may be referred to as a hybrid pixel operation scheme.

In the above operation, the signal levels are read three times, in which the signal difference between the overflow signal level and the reset signal level becomes the actual overflow signal level and the signal difference between the reset signal level and the PD signal level becomes the actual PD signal level.

Figure 6:
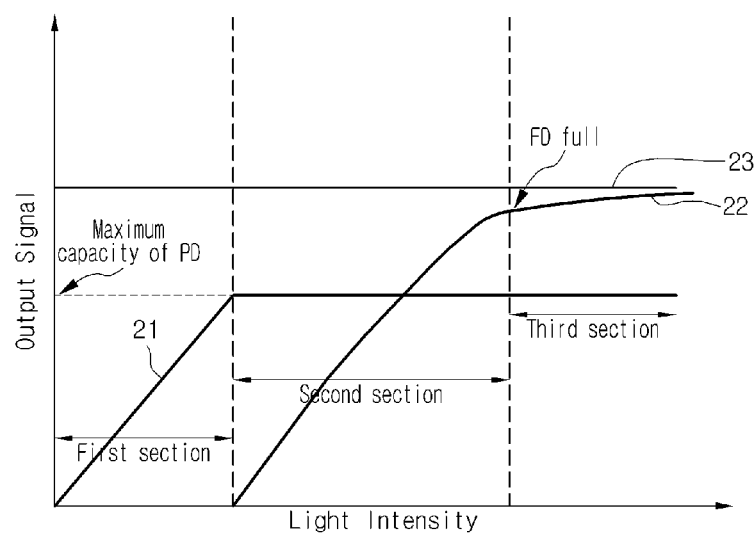
FIG. 6 is a graph showing an output signal as a function of the light intensity of a pixel array according to one embodiment in the 4T operation section and the 3T operation section.

FIG. 6 is a graph showing an output signal as a function of the light intensity of the pixel array according to one embodiment in the 4T operation section and the 3T operation section.

The first section shown in FIG. 6 is subject to the low intensity of illumination or the normal intensity of illumination where the overflow charges are not generated from the photodiode PD, so the general 4T operation is performed. At this time, a linear signal level 21 is detected until it reaches the maximum capacity of the photodiode PD. The 3T operation is performed in the second and third sections, in which a signal level 22 represents the linear characteristic in the early stage and then represents the log characteristic converged to the asymptotic line 23 after the reset transistor RX has been turned on. In detail, the overflow charges start to generate from the photodiode PD in the second section. According to the embodiment, as described above, the overflow charges generated from the photodiode PD are not discarded, but the signal level of the overflow charges is read. The third section starts after the overflow charges have been fully filled in the storage region and represents the sub-threshold behavior before the reset transistor RX is turned on. Thus, the output signal is very slowly increased in the vicinity of the turn-on of the reset transistor RX and represents the log characteristic converged to the asymptotic line 23. In other words, even if the light having the high intensity is incident, the output signal is converged to the asymptotic line 23 due to the subthreshold behavior of the reset transistor RX without exceeding the maximum capacity of the photo-electro conversion unit (that is, the photodiode PD), so the dynamic range can be expanded as wide as possible.

Figure 7:
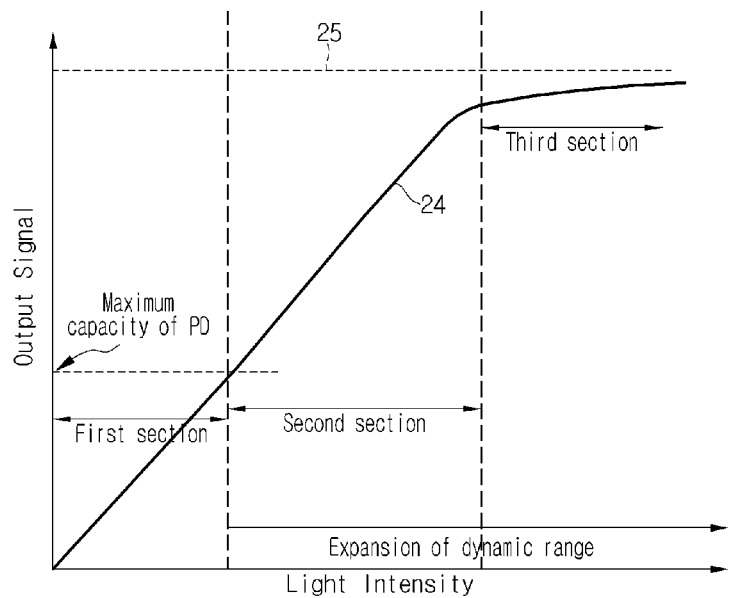
FIG. 7 is a graph obtained by combining the 4T operation section and the 3T operation section shown in FIG. 6.

FIG. 7 is a graph showing the expanded dynamic range of the pixel array according to one embodiment. A line 24 shown in the graph of FIG. 7 is obtained by combining the line 21 of the 4T operation and the line 22 of the 3T operation shown in FIG. 6.

As shown in FIG. 7, the signal represents the linear characteristic in the first and second sections, and represents the log characteristic converged to the asymptotic line 23 in the third section. It can be understood from FIG. 7 that the dynamic range is remarkably expanded as compared with that of the related art.

The signal level shown in FIG. 7 may be obtained through the single exposure, other than the dual exposure, so the operational speed may be faster than that of the technology realizing the WDR through the multiple exposure. Thus, the WDR pixel can easily realize the high speed frame rate under the higher resolution.

In addition, since the same storage region, that is, the same floating diffusion node FD is used when reading the signal level of the overflow signal, the linearity can be constantly maintained when combining the signal having the low intensity of illumination with the signal having the high intensity of illumination. In addition, the 4T pixel operation using the transfer transistor TX is used when reading the signal level of the photodiode PD, the quality of the image having the low intensity of illumination can be ensured.

Figure 8:
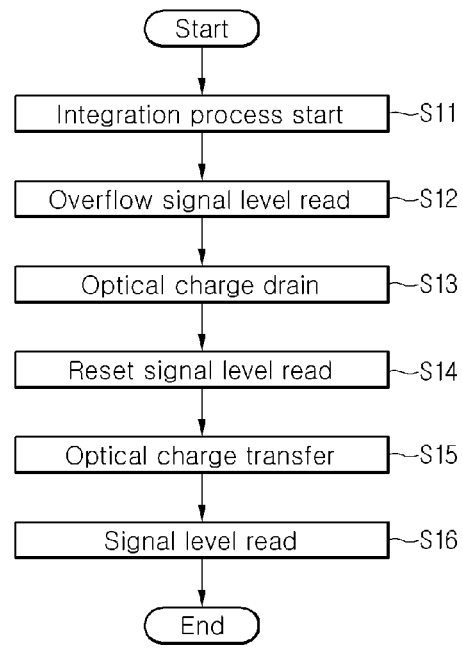
FIG. 8 is a flowchart showing the procedure for operating a pixel array according to the embodiment.

FIG. 8 is a flowchart showing the procedure for operating a pixel array according to the embodiment.

In step S11, the transfer transistor TX and the reset transistor RX are turned on to drain all charges of the floating diffusion node FD and the photodiode PD and then the transfer transistor TX and the reset transistor RX are turned off to start the integration process.

In step S12, the signal level of the overflow charges of the photo-electro conversion unit is read.

In step S13, the reset transistor RX is turned on to drain the charges stored in the storage region.

In step S14, the reset signal level of the storage region is read.

In step S15, the transfer transistor TX is turned on to transfer the charges stored in the photo-electro conversion unit to the storage region.

In step S16, the signal level of the charges transferred to the storage region is read.

After the process for reading the signal level has been completed, the difference between the overflow signal level and the reset signal level becomes the actual overflow signal level and the difference between the reset signal level and the PD signal level becomes the actual PD signal level.

Figure 9:
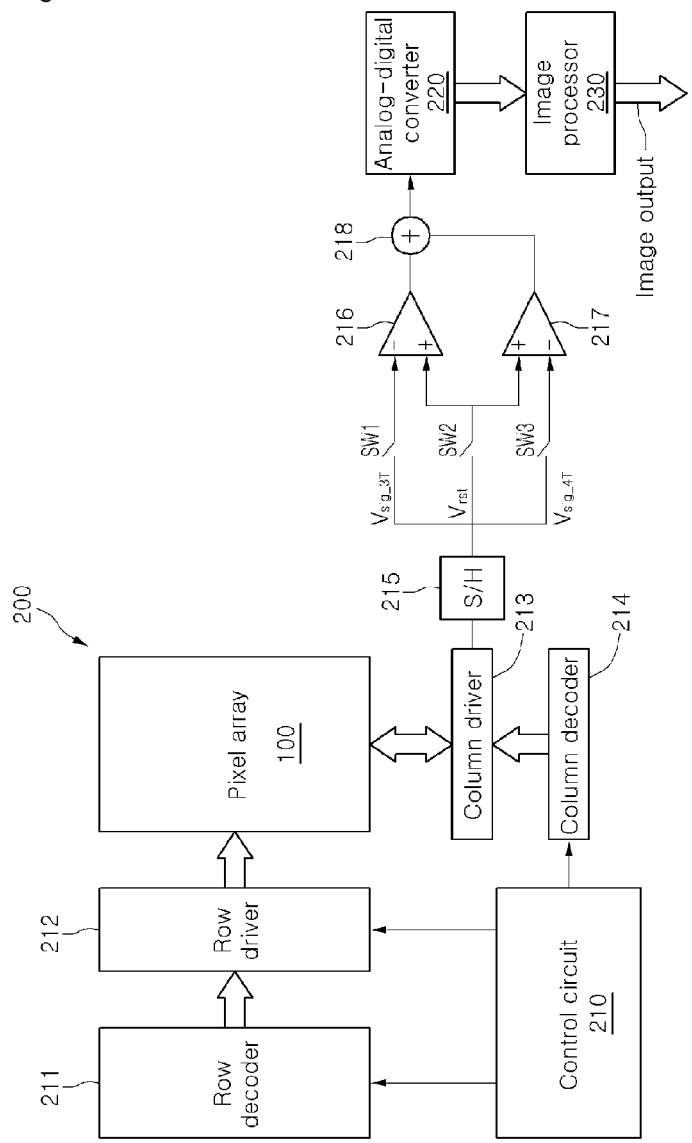
FIG. 9 is a block view showing the structure of an imaging apparatus according to one embodiment.

The method for operating the pixel according to the embodiment may be employed in the pixel array 100 of an imaging apparatus 200 as shown in FIG. 9. The pixel array 100 includes a plurality of pixels, which are configured and operated according to at least one of the embodiments described above. The pixels are arranged in the form of a matrix including columns and rows. A signal processing circuit is connected to the pixel array 100 and a part of the signal processing circuit is formed on a substrate. The pixel in each row of the pixel array 100 is turned on at the same time by the row selection line and selectively output by each column selection line. A plurality of row lines and column lines are provided in the pixel array 100. The row lines are selectively activated by the row driver 212 according to a row address decoder 211. Thus, the row and column addresses are provided for each pixel.

The CMOS imaging apparatus 200 is operated by a control circuit 210, which controls address decoders 211 and 214 in order to select proper row and column lines to apply the control voltage to the transfer and reset transistor. In addition, the control circuit 210 controls row and column driver circuits 212 and 213 to apply the driving voltage to the drive transistor of selected row and column lines. A pixel column signal including an overflow level signal Vsig_3T, a pixel reset signal Vrst, and a pixel image signal Vsig_4T is read by a sample/hold circuit 215.

The actual overflow level signal and the actual pixel image signal are calculated through differential amplifiers 216 and 217 based on the signal read by the sample/hold circuit 215. In detail, when the overflow signal level is read, a switch SW1 is turned on, so that the overflow level signal Vsig_3T is output. In addition, when the reset signal level is read, a switch SW2 is turned on, so that the reset level signal Vrst is output. Further, when the signal level is read, a switch SW3 is turned on, so that the signal level Vsig_4T is output. The first differential amplifier 216 calculates the actual overflow signal level Vrst-Vsig_3T and the second differential amplifier 217 calculates the actual signal level Vrst-Vsig_4T based on the output signals. The calculated actual signals are combined by a summer 218 and then output. The signals combined by the summer 218 represent the output shown in the graph of FIG. 7.

The signals output through the summer 216 are digitalized through an analog-digital converter 220. The analog-digital converter 220 supplies digital pixel signals to an image processor 230 that forms and outputs digital images.

Meanwhile, although the method for operating the pixel according to the above embodiments can expand the dynamic range as compared with the related art, as described above with reference to FIG. 7, the output signal may represent the log characteristic when the charges are fully filled in the floating diffusion node FD. That is, the output signal represents the log characteristic in and after the third section. If the log characteristic is represented in the sections, the processing algorism of the image processor 230 of the imaging apparatus 200 becomes complex. Thus, in order to facilitate the signal processing, it is preferred to expand the dynamic range while ensuring the linearity of the output signal.

If the gradient of the section representing the linear characteristic in the 3T operation sections of FIG. 7 is lowered, that is, if the gradient of the second section is lowered, the dynamic range representing the linearity can be expanded. According to one embodiment, the dynamic range representing the linearity can be expanded by reducing the overflow integration time for accumulating the overflow charges in the photodiode PD.

Figure 10:
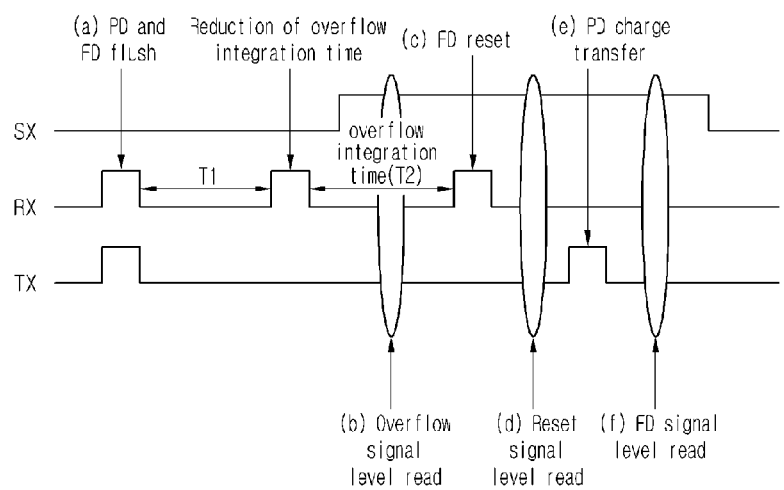
FIG. 10 is a timing diagram showing a method for operating switching devices to expand the dynamic range having the linear characteristic according to one embodiment.

FIG. 10 is a timing diagram showing a method for operating switching devices to expand the dynamic range having the linear characteristic according to one embodiment.

As shown in FIG. 10, the reset transistor RX and the transfer transistor TX are turned on for the purpose of PD and FD flush (a) and the reset transistor RX is turned on one more before the overflow charges generated from the photodiode PD are accumulated in the storage region. Then, the charges accumulated in the storage region are drained once and the overflow integration process is performed. If the reset transistor RX is not turned on one more, that is, in the case of the embodiment shown in FIG. 3, the integration time for integrating the overflow charges in the storage region is T1+T2. However, if the reset transistor RX is turned on one more, the overflow integration time T2 may be reduced. According to the above structure, the dynamic range representing the linear characteristic can be expanded, which will be described later.

The subsequent processes are the same as the processes described with reference to FIG. 3.

Figure 11:
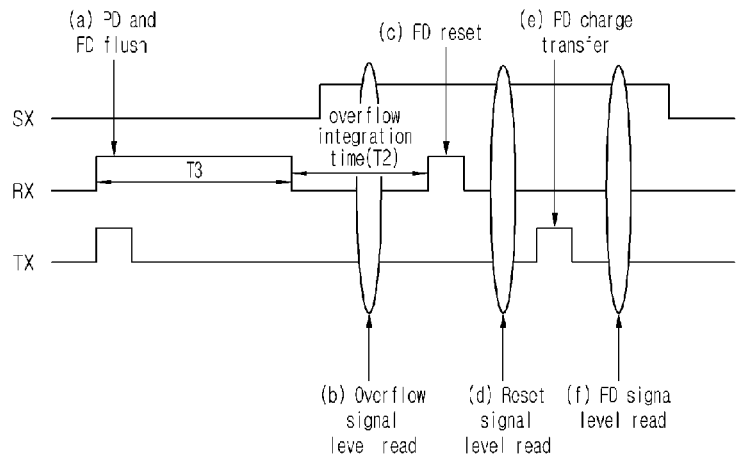
FIG. 11 is a timing diagram showing a method for operating switching devices to expand the dynamic range having the linear characteristic according to another embodiment.

FIG. 11 is a timing diagram showing a method for operating switching devices to expand the dynamic range having the linear characteristic according to another embodiment.

As shown in FIG. 11, the reset transistor RX is turned on for the purpose of PD and FD flush (a) and the turn-on state of the reset transistor RX is maintained for a predetermined interval T3. Since the reset transistor RX is turned on, the overflow charges are not integrated in the storage region. The overflow charge integration may start after the reset transistor RX has been turned off.

In FIGS. 10 and 11, T1 and T3 represent the intervals where the overflow integration time is reduced. If T1 and T3 are increased, the overflow integration interval T2 may be reduced.

Figure 12:
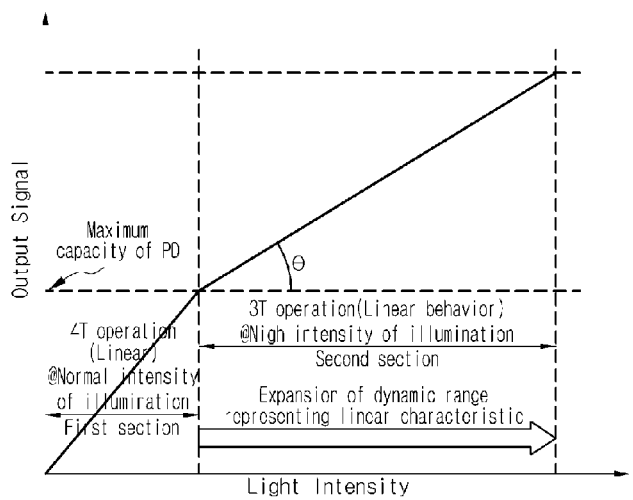
FIG. 12 is a graph showing an output signal obtained through a method for operating a pixel representing the expanded dynamic range having the linear characteristic.

FIG. 12 is a graph showing an output signal obtained through a method for operating a pixel representing the expanded dynamic range having the linear characteristic. When comparing with FIG. 7, the dynamic range representing the linearity (that is, the second section) is expanded in FIG. 12.

In FIG. 10, if the interval T1 between two reset switching signals is enlarged, the overflow integration interval T2 may be reduced and the gradient θ of the second section in FIG. 12 may be lowered. In this case, the dynamic range representing the linear characteristic can be more widened. If the interval T1 is narrowed, the overflow integration interval T2 and the gradient θ are increased. In this case, the dynamic range representing the linear characteristic can be reduced.

In the same way, if the turn-on interval T3 of the reset switching device RX is increased in FIG. 11, the overflow integration interval T2 may be reduced and the gradient θ of the second section in FIG. 12 may be lowered. In this case, the dynamic range representing the linear characteristic can be more widened. If the interval T3 is narrowed, the overflow integration interval T2 and the gradient θ are increased. In this case, the dynamic range representing the linear characteristic can be reduced.

Figure 13:
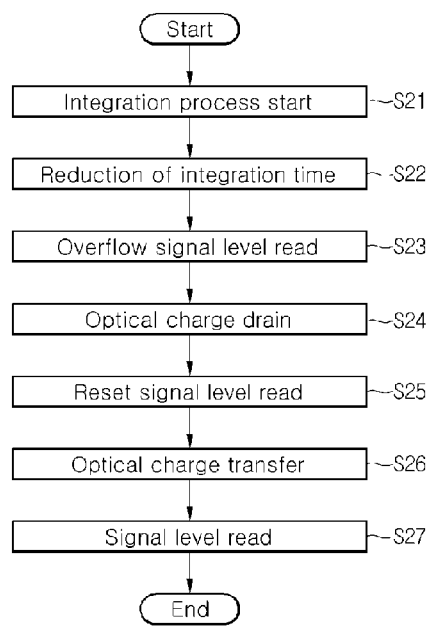
FIG. 13 is a flowchart showing a method for operating a pixel according to one embodiment.

FIG. 13 is a flowchart showing a method for operating a pixel according to one embodiment.

The steps shown in FIG. 13 are the same as steps S11 to S16 shown in FIG. 8 except for step S22. When comparing with the steps shown in FIG. 8, step S22 for reducing the integration time for accumulating the overflow charges in the storage region is added after the start of the integration process S21. As described above, the overflow charge integration time can be reduced by turning on the reset switching unit RX one more as shown in FIG. 10 or increasing the turn-on time of the reset switching unit RX as shown in FIG. 11.

If the dynamic range representing the linear characteristic is expanded according to the above procedure, the algorism executed in the image processor can be more simplified.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. An imaging apparatus comprising:
a photo-electro conversion unit on a substrate;
a transfer switching unit on the substrate at one side of the photo-electro conversion unit;

a storage region on the substrate at one side of the transfer switching unit;

a plurality of pixels including a reset switching unit on the substrate at one side of the storage region; and a control circuit reading a signal level and a reset signal level and applying a signal to the transfer switching unit and the reset switching unit, wherein the control circuit reduces an integration time required for accumulating overflow charges generated from the photo-electro conversion unit in the storage region, and reads an overflow level of the photo-electro conversion unit, and wherein the overflow level read by the control circuit is used for calculating an actual overflow signal.

2. The imaging apparatus of claim 1, wherein the control circuit applies again a reset signal to the reset switching unit before reading the overflow level of the photo-electro conversion unit to reduce the integration time required for accumulating the overflow charges in the storage region.

3. The imaging apparatus of claim 1, wherein the control circuit maintains a turn-on state of the reset switching unit for a predetermined time before reading the overflow level of the photo-electro conversion unit to reduce the integration time required for accumulating the overflow charges in the storage region.

4. The imaging apparatus of claim 1, wherein the control circuit omits the reading of the overflow level if an overflow charge is not generated in the photo-electro conversion unit.

5. The imaging apparatus of claim 1, wherein the control circuit forms a first signal level based on the overflow level and the reset signal level.

6. The imaging apparatus of claim 5, wherein the control circuit forms a second signal level based on the reset signal level and the signal level of the storage region, and outputs the first and second signal levels.

7. The imaging apparatus of claim 6, wherein the control circuit turns on the transfer switching unit to transfer the stored optical charges from the photo-electro conversion unit to the storage region.

8. The imaging apparatus of claim 6, wherein the control circuit reads the signal level of optical charges transferred to the storage region.

9. The imaging apparatus of claim 6, wherein the same storage region is used when reading the overflow level.

10. The imaging apparatus of claim 6, further comprising a summer combining the first signal level and the second signal level and providing the actual overflow signal.

11. The imaging apparatus of claim 10, further comprising an analog-digital converter (ADC) connected to the summer.

12. The imaging apparatus of claim 1, wherein the control circuit applies a reset signal to the reset switching unit to drain optical charges stored in the storage region, and reads the reset signal level.

* * * * *